(12) United States Patent
Su

(10) Patent No.: US 10,541,481 B2
(45) Date of Patent: Jan. 21, 2020

(54) CONNECTOR EQUIPPED WITH CARRIER FRAME AND RAIL FRAME FOR CPU

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Po-Yuan Su, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

(*) Notice: Subject to any disclaimer, the term of this patent is extended or adjusted under 35 U.S.C. 154(b) by 0 days.

(21) Appl. No.: 16/258,687

(22) Filed: Jan. 28, 2019

(65) Prior Publication Data

US 2019/0245287 A1    Aug. 8, 2019

(30) Foreign Application Priority Data

Feb. 7, 2018 (CN) ..................... 2018 2 0210165 U

(51) Int. Cl.
*H01R 13/62* (2006.01)
*H01R 12/70* (2011.01)
*H01R 12/52* (2011.01)
*H01R 13/24* (2006.01)
*H01R 12/71* (2011.01)
*H01R 13/639* (2006.01)
(Continued)

(52) U.S. Cl.
CPC ......... *H01R 12/7076* (2013.01); *H01R 12/52* (2013.01); *H01R 12/712* (2013.01); *H01R 13/24* (2013.01); *H01R 13/502* (2013.01); *H01R 13/639* (2013.01); *H05K 7/1061* (2013.01)

(58) Field of Classification Search
CPC .. H05K 7/1053; H05K 7/1023; H05K 7/1038; H01R 13/193
USPC .................. 439/331, 73, 330, 342, 525, 526
See application file for complete search history.

(56) References Cited

U.S. PATENT DOCUMENTS 8,337,231 B2 * 12/2012 Hsu ...................... H05K 7/1053
                                                          439/342
8,500,477 B2 *  8/2013 Yeh ......................... H05K 7/12
                                                          439/342
(Continued)

FOREIGN PATENT DOCUMENTS

CN      103515764 B     2/2016
CN      205944491 U     2/2017

*Primary Examiner* — Phuong Chi Thi Nguyen
(74) *Attorney, Agent, or Firm* — Wei Te Chung; Ming Chieh Chang

(57) ABSTRACT

An electrical connector includes a fastener plate, a rail frame pivotally mounted to one end of the fastener plate, a carrier frame assembled to the rail frame in a sliding manner, and a load plate pivotally mounted to the end of the fastener plate outside of the rail frame. The carrier frame includes latches to retain the CPU thereon. The rail frame includes a pair of opposite sliding channels extending in the front-to-back direction, along which the carrier frame is moveable. A front transverse bar is located in front of the sliding channels. A pair of protection blocks are located in front of the pair of sliding channels for protecting the latches of the carrier frame or the CPU.

14 Claims, 6 Drawing Sheets

(51) Int. Cl.
*H05K 7/10* (2006.01)
*H01R 13/502* (2006.01)

(56) References Cited

U.S. PATENT DOCUMENTS

| | | | | |
|---|---|---|---|---|
| 8,587,947 B2* | 11/2013 | Yonemochi | ......... | H01L 23/4093 |
| | | | | 174/252 |
| 8,801,439 B2* | 8/2014 | Sato | ........................ | H01R 13/22 |
| | | | | 439/342 |
| 8,834,192 B2* | 9/2014 | Terhune, IV | ........ | H05K 7/1053 |
| | | | | 439/331 |
| 8,932,067 B2* | 1/2015 | Yeh | ...................... | H05K 7/1053 |
| | | | | 439/68 |
| 9,118,128 B2* | 8/2015 | Takahashi | .............. | H01R 13/11 |

* cited by examiner

CONNECTOR EQUIPPED WITH CARRIER FRAME AND RAIL FRAME FOR CPU

BACKGROUND OF THE INVENTION

1. Field of the Invention

The present invention relates generally to an electrical connector, and more particularly to the connector connecting a CPU (Central Processing Unit) to a PCB (Printed Circuit Board).

2. Description of Related Arts

China Patent No. 205944491, the inventor's previous design, discloses an electrical connector equipped with a pivotal rail frame to supportably guide a carrier frame and the associated CPU thereon. Anyhow, because the rail frame is required to be raised up with a distance for not interfering with the corresponding components on the PCB, there is a possibility for the transverse bar at the free end of the rail frame to damage the latches of the carrier frame or even the CPU during loading the carrier frame into the rail frame.

An electrical connector is desired to have some protection device around the transverse bar of the rail frame for preventing damage of the latches of the carrier frame or the CPU during assembling.

SUMMARY OF THE INVENTION

An object of the invention is to provide an electrical connector for connecting a CPU to a PCB. The connector includes a fastener plate, a rail frame pivotally mounted to one end of the fastener plate, a carrier frame assembled to the rail frame in a sliding manner, and a load plate pivotally mounted to the end of the fastener plate outside of the rail frame. The carrier frame includes latches to retain the CPU thereon. The rail frame includes a pair of opposite sliding channels extending in the front-to-back direction, along which the carrier frame is moveable. A front transverse bar is located in front of the sliding channels. A pair of protection blocks are located in front of the pair of sliding channels for protecting the latches of the carrier frame or the CPU.

The rail frame includes a pair of guiding sections at the front ends of the pair of sliding channels with a curvedly expansion opening opposite to the corresponding protecting blocks.

DETAILED DESCRIPTION OF THE PREFERRED EMBODIMENT

Figure 1:
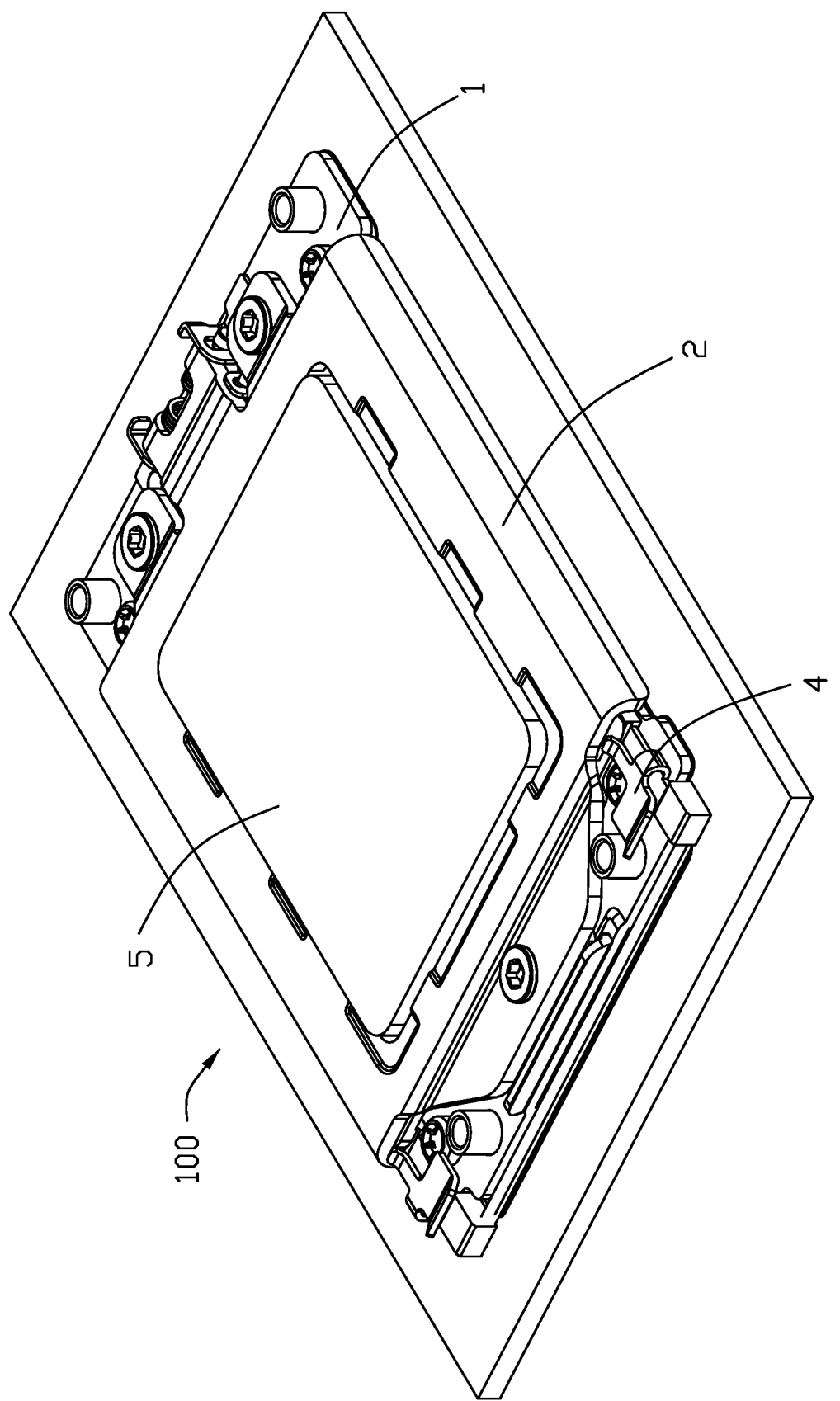
FIG. 1 is a perspective view of an electrical connector assembly according to the invention.
Figure 2:
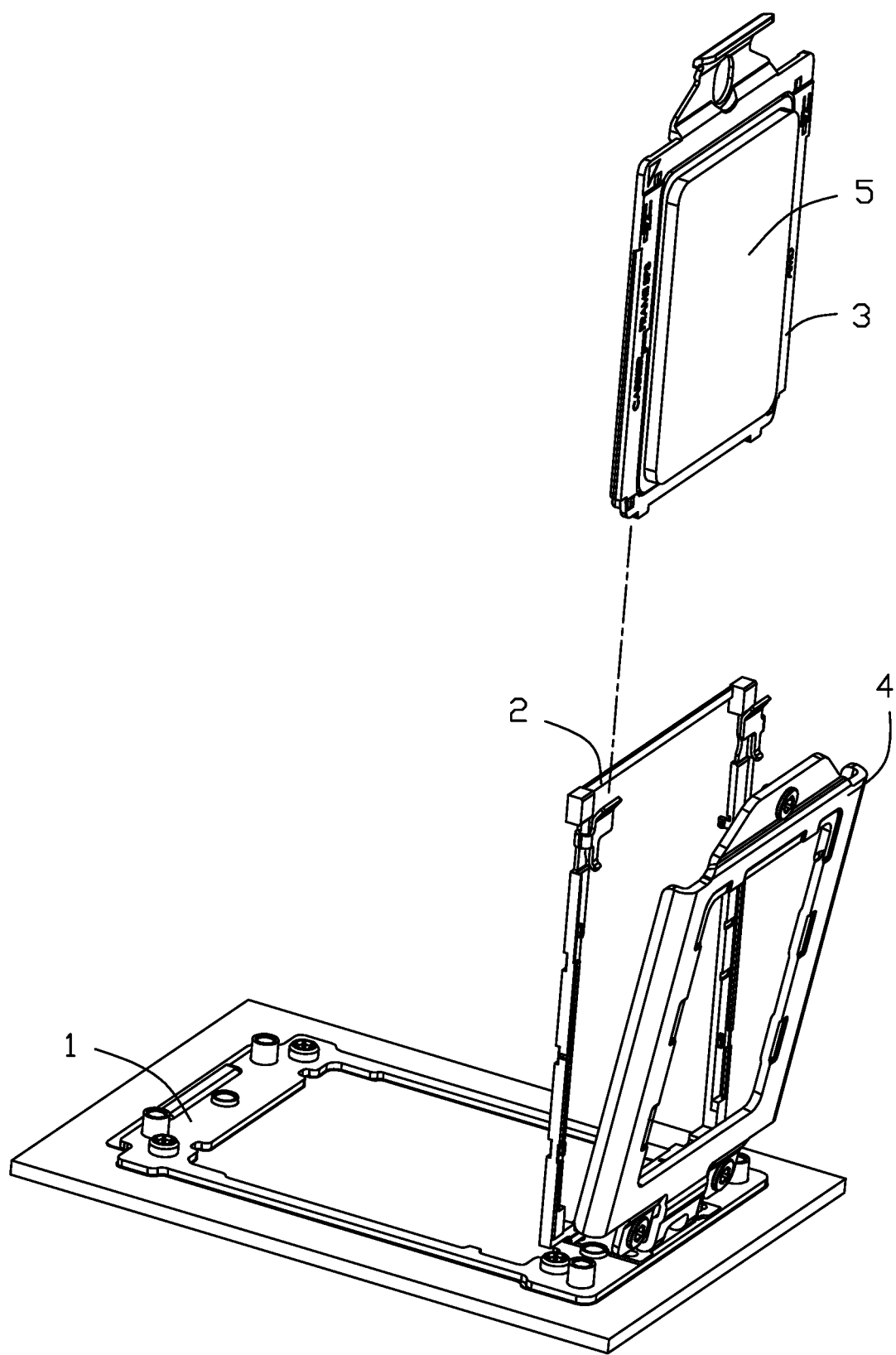
FIG. 2 is a perspective view of the electrical connector assembly of FIG. 1 wherein both the load plate and the rail frame are in an open status and the carrier frame with the associated CPU is removed from the rail frame.
Figure 3:
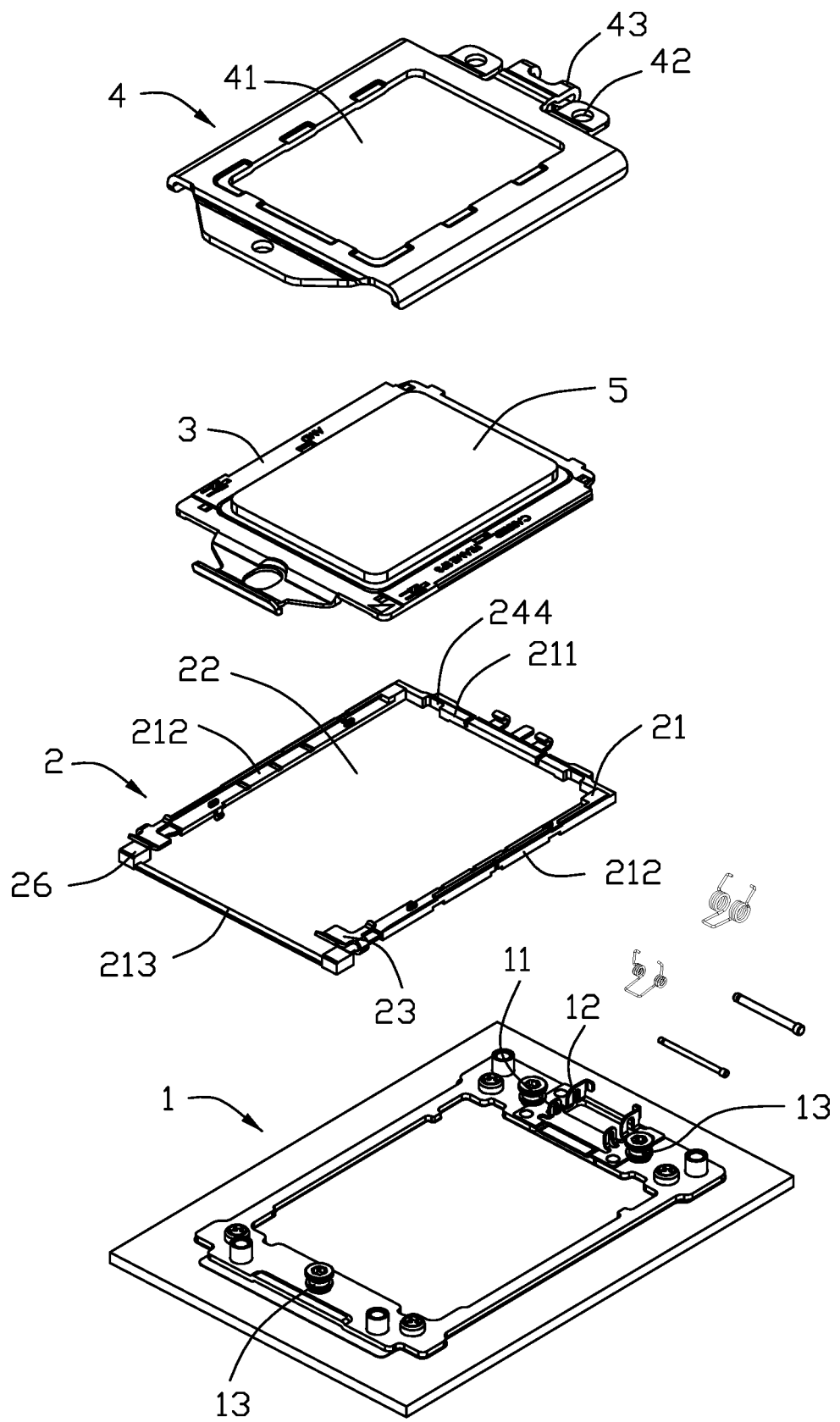
FIG. 3 is an exploded perspective view of the electrical connector assembly of FIG. 2 wherein both the load plate and the rail frame are removed from the fastener plate.
Figure 4:
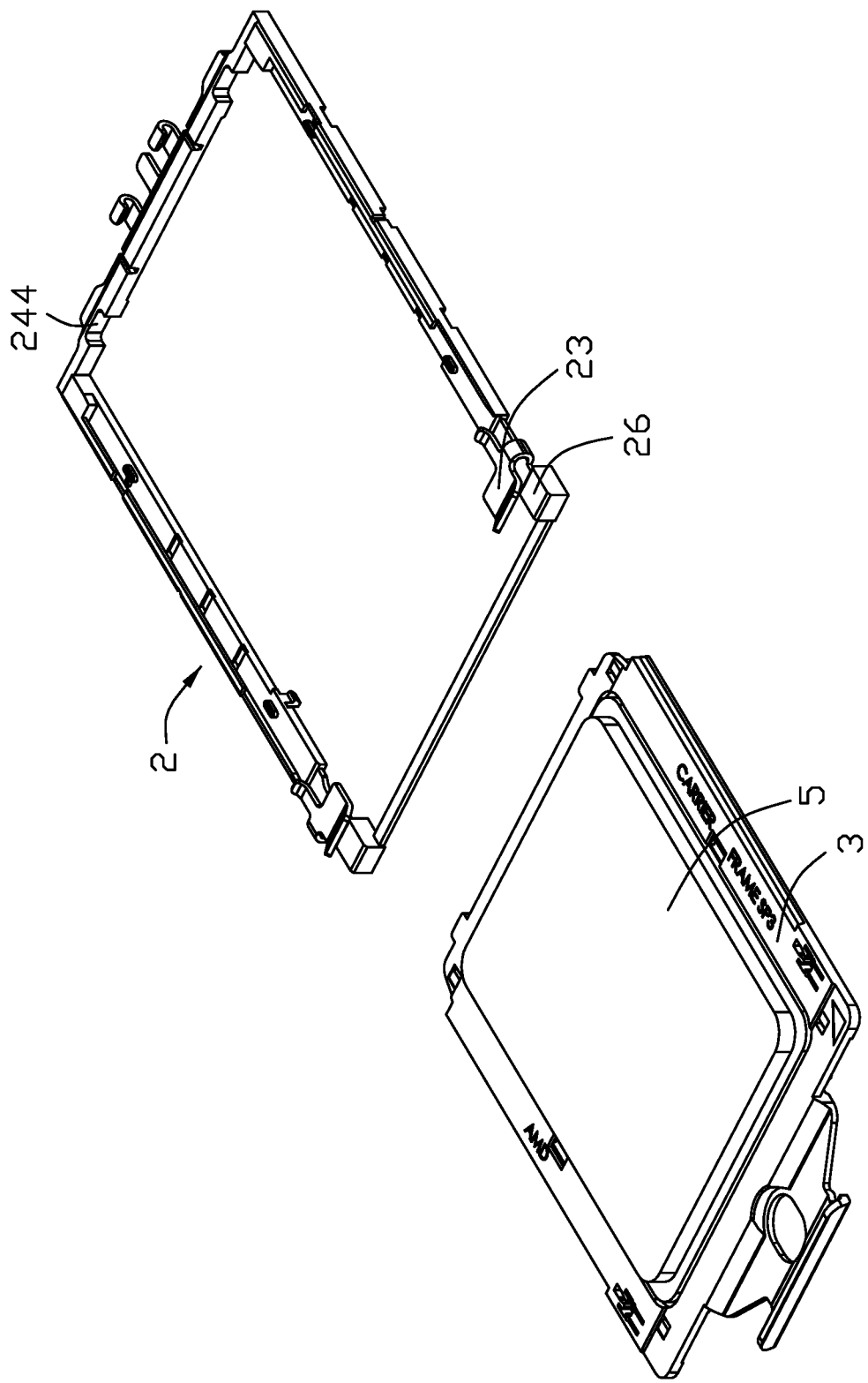
FIG. 4 is a perspective view of the carrier frame with the associated CPU removed away from the rail frame of the electrical connector assembly of FIG. 3.
Figure 5:
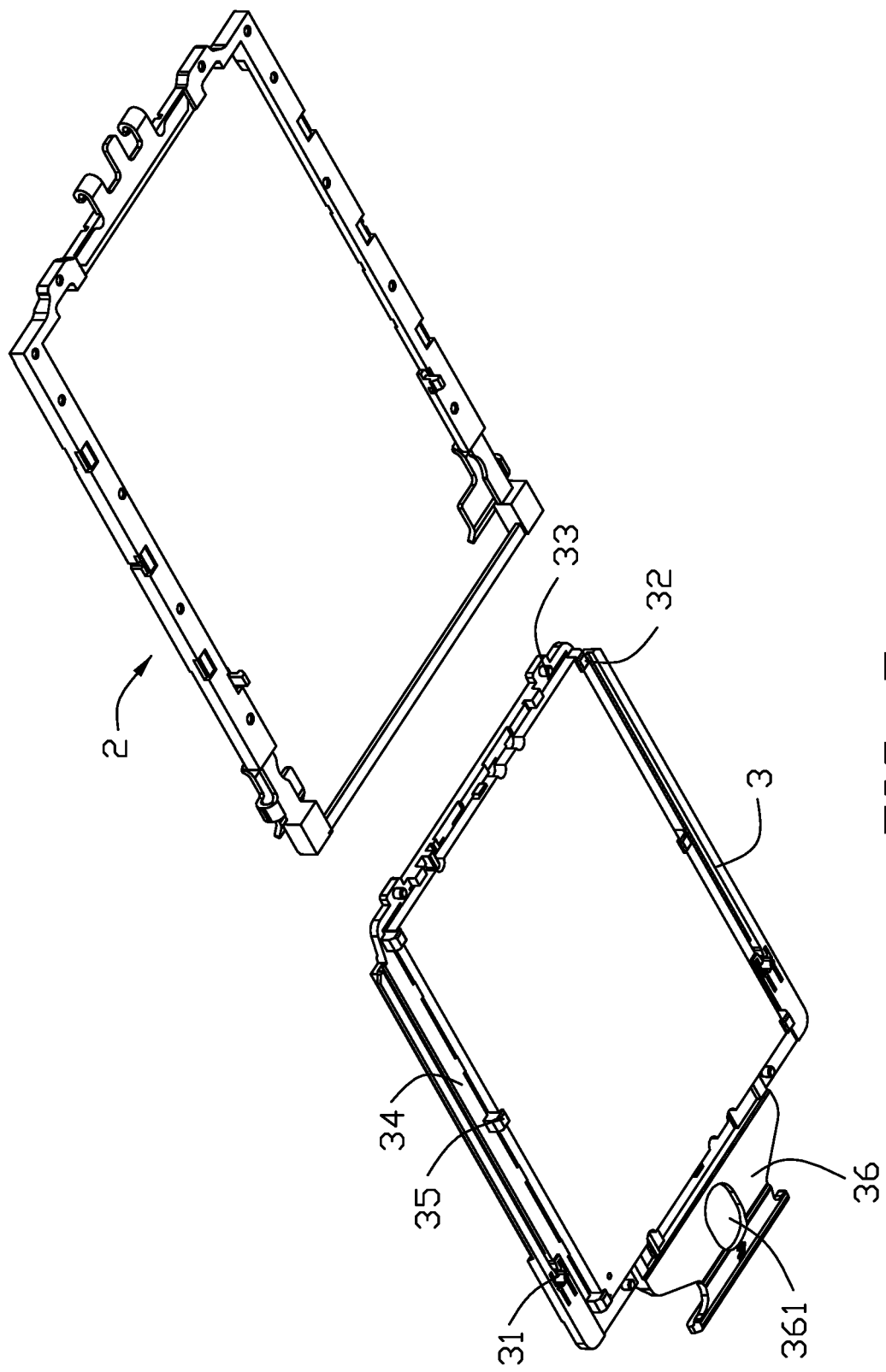
FIG. 5 is another perspective view of the electrical connector assembly of FIG. 4.
Figure 6:
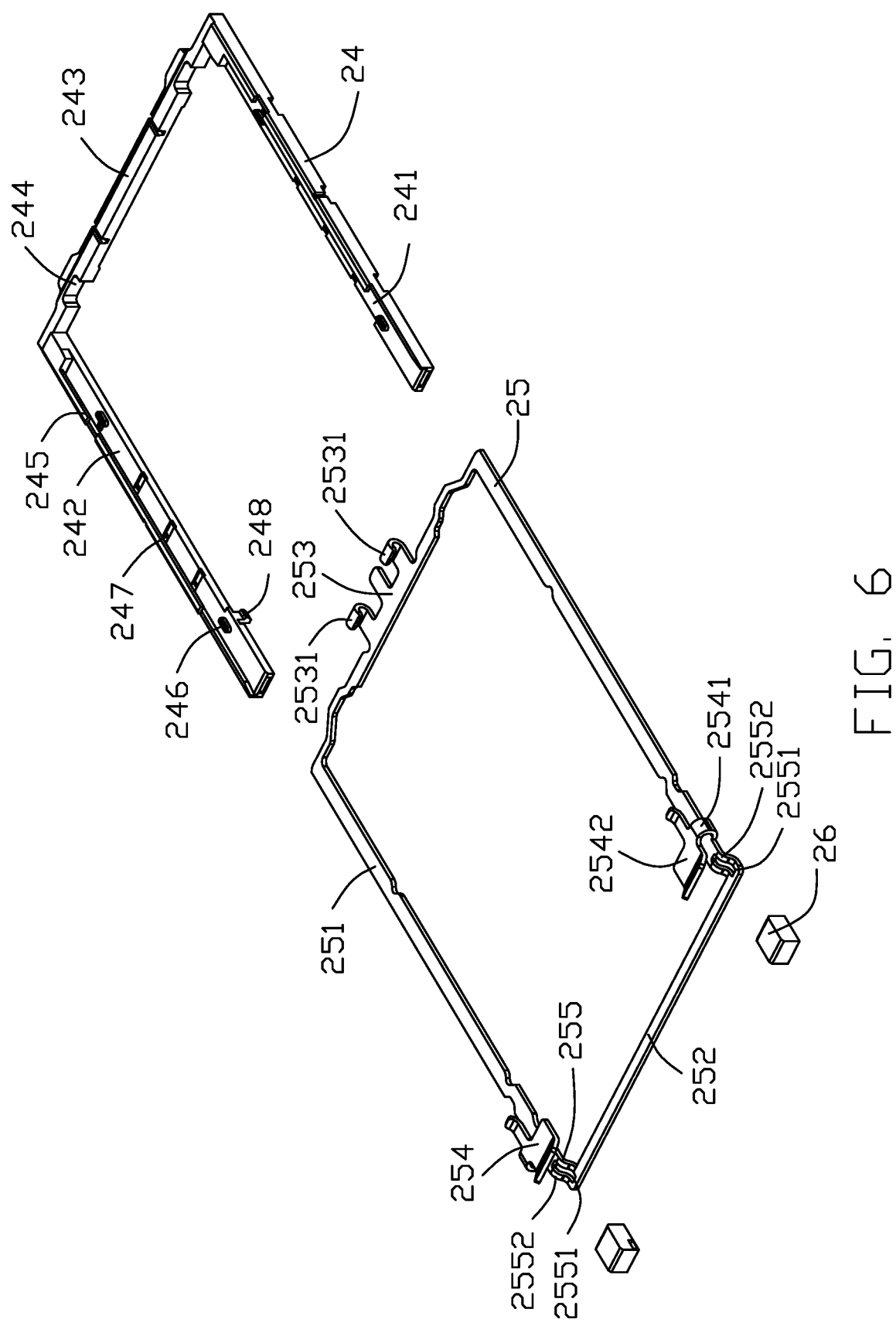
FIG. 6 is an exploded perspective view of the rail frame.

Referring to FIG. 1-6, an electrical connector assembly 100 for receiving a CPU 5 therein for electrically connecting to a PCB (not labeled), includes a metallic fastener plate 1 mounted to the PCB, a rail frame 2 pivotally mounted to a rear end of the fastener plate 1, a carrier frame 3 assembled to the rail frame in a sliding manner, and a load plate 4. Notably, a connector unit (not shown) should be located in the space surrounded by the fastener plate 1 so as to receive the CPU 5 therein during operation.

The fastener plate 1 has a first pivotal section 11 and a second pivotal section 12. The rail frame 2 is pivotally mounted upon the first pivotal section 11, and the load plate 4 is pivotally mounted upon the second pivotal section 12. The CPU 5 is adapted to be retained upon the carrier frame 3 so as to be further assemble to the rail frame 2 via the carrier frame 3 and downwardly pressed by the load plate 4. A pair of fastening devices or screws 13 downwardly press the rear end of the load plate 4, and another fastening device 13 downwardly presses the front end of the load plate 4.

The rail frame 2 includes a bar sub-assembly 21 forming an opening 22. The bar subassembly 21 includes a first/rear (transverse) bar 211 at a rear end, a pair of second/side (elongated) bars 212 on two lateral sides, and a third/front (transverse) bar 213 at a front end. A pair of sliding channels are formed in the pair of second bars 212. A guiding section 23 is formed at a front end of each sliding channel.

In this embodiment, the rail frame 2 is composed of the metal piece 25 embedded within an insulator 24 via an insert-molding process.

The insulator 24 is of a U-shaped configuration, including a side arm 241, another side arm 242 and a rear arm 243 linking those two side arms 241 and 242. Each side arm 241, 242 has a flange 245, and a plurality of standoffs 246, 247, and a latch 248 for engagement with the connector unit (not shown) when the rail frame 2 is moved to the horizontal position.

The metal piece 25 is of a frame structure, including a pair of side rods 251, a front rod 252 and a rear rod 253. The front rod 252 abuts against the front end of the fastener plate 1 and results in the front bar 213. The side rods 251 cooperate with the side arms 241 to form the side bars 212. The rear rod 253 cooperates with the rear arm 243 to form the rear bar 211. The rear rod 253 forms a pair of bending sections 2531 to be pivotally mounted upon the first pivotal section 11.

The metal piece 25 includes a pair of leading sections 254 unitarily extending from the corresponding side rods 251 and opposite to each other in the transverse direction so as to form an enlarged opening in front of each guiding channel for facilitating assembling of the carrier frame 3 with the associated CPU 5 thereto. Each leading section 254 has a vertical section 2541 and a horizontal section 2542 wherein the horizontal section 2542 forms an enlarged opening 255. Notably, the leasing section 254 is same with the aforementioned guiding section 23 of the whole rail frame 2.

The front bar 213 is equipped with a pair of insulative protection blocks 26 opposite to the openings 255 in the vertical direction, respectively. The side rod 251 further includes a connection section 2552 connecting to the front rod 252, and each connection section 2552 forms a slot 2551 therein for integrally formed with the protection block 26.

The load plate 4 is made of metal, and includes a cavity 41 to receive the CPU 5 therein. The load plate 4 includes a pivotal section 43 pivotally mounted to the second pivotal section 12. The load plate 4 further includes three fastening holes 42 cooperating with the fastening devices 13 to fasten the load plate 4 in position upon the fastener plate 1.

The carrier frame 3 is made of plastic, being in a frame structure 34 The carrier frame 3 includes an opening to receive the CPU 5, and a pair of sliding sides. The carrier frame 3 is guided, via the guiding section 23, to enter the corresponding channel in the side bar 212 by means of the sliding sides. The carrier frame 3 includes a pair of sliding slots 31 to cooperate with the flanges 45 for guiding sliding of the carrier frame 3 along the channels. A fixing hole 32 is formed in the sliding slot 31 for cooperating with the flange 45. A pair of posts 33 of the carrier frame cooperate with the recesses 244. The carrier frame 3 includes a plurality of latches 35 for engagement with a bottom surface of the CPU 5. In this embodiment, the latches 35 of the carrier frame 3 are located lower than the latches 248 of the rail frame 2 A handle 36 is formed at a front end of manual use of the user. An opening 361 is formed in the handle 36 and aligned with the fastening hole 42 for extension of the corresponding fastening device 13.

In this embodiment, the protection block 26 is raised up from the front bar 213, i.e., the front rod 252, so that the conductive pads on the bottom face of the CPU 5 and the latches 35 will not be interfered with the front bar 213, i.e., the front rod 252, during insertion/withdrawal of the carrier frame 3 into/from the rail frame 2. In this embodiment, the connection section 2552 is downward deflected while the leading section 254 is upwardly deflected so as to form an enlarge insertion opening 255 for easy insertion of the carrier frame 3 into the rail frame 2. In this embodiment, the horizontal section 2542 forms not only a forwardly flared structure for enlarging the insertion opening for easy insertion of the carrier frame 3 but also a rearwardly flared structure for easy withdrawal of the carrier frame 3.

What is claimed is:

1. An electrical connector assembly comprising:
   a printed circuit board (PCB);
   a metallic fastener plate secured upon the PCB;
   a load plate pivotally mounted on a first end of the fastener plate;
   a rail frame pivotally mounted upon a second end of the fastener plate and defining a pair of side channels; and
   a carrier frame defining two lateral sides adapted to be sliding along the side channels for assembling or disassembling with the rail frame, an opening with a latch aside adapted for retaining and receiving a Central Processing Unit (CPU) therein;
   the rail frame being made of a metal piece integrally formed within an insulator via an insert-molding process, said metal piece including a pair of side rod with a pair of opposite leading sections around a front end of the rail frame, and a front rod connected between the pair of side rod at the front end of the rail frame; wherein
   a connection section linked between the side rod and the front rod is downwardly deflected while the leading section is upwardly deflected so as to form an enlarged insertion opening for easy insertion of the carrier frame into the corresponding channel.

2. The electrical connector assembly as claimed in claim 1, wherein the front rod is seated upon the fastener plate when said rail frame is moved to a horizontal position.

3. The electrical connector assembly as claimed in claim 1, wherein the first end of the fastener plate and the second end of the fastener plate are same.

4. The electrical connector assembly as claimed in claim 1, wherein each leading section unitarily extends from the corresponding side rod with a vertical section and a horizontal section, and the horizontal section forms a forwardly flared structure for enlarging said insertion opening.

5. The electrical connector assembly as claimed in claim 4, wherein said horizontal section further includes a rearward flared structure for easy withdrawal of the carrier frame from the rail frame.

6. The electrical connector assembly as claimed in claim 1, wherein an insulative block is integrally formed upon a pair of corners between the front rod and the pair of side rods so as to have the carrier frame spaced from the front rod during assembling/disassembling without damaging either the carrier frame or the CPU.

7. The electrical connector assembly as claimed in claim 6, wherein said carrier frame includes latches for engagement of the CPU, and the block is used to protect the latches.

8. The electrical connector assembly as claimed in claim 7, wherein the rail frame includes on a bottom side latches which are positioned lower than the latches of the carrier frame.

9. An electrical connector assembly comprising:
   a printed circuit board (PCB);
   a metallic fastener plate secured upon the PCB;
   a load plate pivotally mounted on a first end of the fastener plate;
   a rail frame pivotally mounted upon a second end of the fastener plate and defining a pair of side channels; and
   a carrier frame defining two lateral sides adapted to be sliding along the side channels for assembling or disassembling with the rail frame, an opening with a latch aside adapted for retaining and receiving a Central Processing Unit (CPU) therein;
   said rail frame including opposite front and rear bars with a pair of side bars linked therebetween, each side bar including a guiding section at a front end with an upwardly flared structure thereof for enlarging a corresponding insertion opening thereabouts.

10. The electrical connector assembly as claimed in claim 9, wherein the front bar is lower than the pair of side bars when the rail frame is moved to a horizontal position.

11. The electrical connector assembly as claimed in claim 9, wherein a pair of insulative blocks are formed at the front ends of said pair of side bars, respectively, for raising up the lateral sides of the carrier frame during insertion.

12. The electrical connector assembly as claimed in claim 11, wherein said carrier frame includes latches for engagement of the CPU, and the block is used to protect the latches.

13. The electrical connector assembly as claimed in claim 9, wherein the rail frame is made of a metal piece integrally formed within an insulator via an insert-molding process, and the guiding sections are made by the metal piece.

14. The electrical connector assembly as claimed in claim 13, wherein the guiding section also forms a rearwardly flared structure for easy withdrawal of the carrier frame from the rail frame.

* * * * *